(12) United States Patent
Gieseke et al.

(10) Patent No.: US 6,798,712 B2
(45) Date of Patent: Sep. 28, 2004

(54) WORDLINE LATCHING IN SEMICONDUCTOR MEMORIES

(75) Inventors: Bruce Alan Gieseke, San Jose, CA (US); William A. McGee, San Jose, CA (US); Ognjen Milic-Strkalj, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 111 days.

(21) Appl. No.: 10/190,372

(22) Filed: Jul. 2, 2002

(65) Prior Publication Data

US 2004/0004901 A1 Jan. 8, 2004

(51) Int. Cl.[7] .................................................. G11C 8/00
(52) U.S. Cl. .............. 365/233; 365/230.06; 365/230.08
(58) Field of Search ........................... 365/233, 230.06, 365/230.08

(56) References Cited

U.S. PATENT DOCUMENTS

| | | |
|---|---|---|
| 5,031,141 A | 7/1991 | Guddat et al. |
| 5,530,677 A | 6/1996 | Grover et al. |
| 5,740,121 A * | 4/1998 | Suzuki et al. ............... 365/233 |
| 6,211,058 B1 | 4/2001 | Wang et al. |
| 6,380,087 B1 | 4/2002 | Gupta et al. |

FOREIGN PATENT DOCUMENTS

| | | |
|---|---|---|
| EP | 0533096 A2 | 9/1992 |
| GB | 2239541 A | 3/1991 |
| JP | 05121369 A | 5/1993 |

* cited by examiner

*Primary Examiner*—David Nelms
*Assistant Examiner*—Tu-Tu Ho
(74) *Attorney, Agent, or Firm*—Mikio Ishimaru

(57) ABSTRACT

A memory system, and method of operation therefor, is provided having memory cells for containing data, bitlines for writing data in and reading data from the memory cells, and wordlines connected to the memory cells for causing the bitlines to write data in the memory cells in response to wordline signals. A decoder is connected to the wordlines for receiving and decoding address information in response to a clock signal and an address signal to select a wordline for a write to a memory cell. Latch circuitry is connected to the decoder and the wordlines. The latch circuitry is responsive to the clock signal for providing the wordline signal to the selected wordline for the write to the memory cell and for removing the wordline signal from the selected wordline when the write to the memory cell is complete.

22 Claims, 3 Drawing Sheets

WORDLINE LATCHING IN SEMICONDUCTOR MEMORIES

BACKGROUND

1. Technical Field

The present invention relates generally to semiconductor memories and more specifically to controlling of wordline signals.

2. Background Art

Microprocessors are used in many applications including personal computers and other electronic systems. A goal of any microprocessor is to process information quickly. One problem has been the communication rate between a microprocessor and main memory. The instructions to be executed by the microprocessor and the data on which operations implemented by the instructions are to be performed are stored at addresses within main memory. To access instructions and data, the microprocessor transmits addresses to main memory. The main memory decodes the address and makes the contents at the requested address available for reading and/or writing. The time required for the microprocessor to transmit an address to main memory and receive the respective contents therefrom can significantly constrain system performance.

One technique, which is used to increase the speed with which the microprocessor processes information, is to provide the microprocessor with an architecture, which includes a fast local memory called a cache memory A cache memory is a small, fast memory that keeps copies of recently used data or instructions. When these items are reused, they can be accessed from the cache memory instead of main memory. Instead of operating at slower main memory access speeds, the microprocessor can operate at faster cache memory access speeds most of the time.

In order to further increase performance, microprocessors have come to include more than one cache memory on the same semiconductor substrate as the microprocessor.

The most commonly used cache memories use static random access memory (SRAM) circuitry, which provide high densities using wordlines and bitlines to access SRAM memory cells. However, in order to place as much memory on the microprocessor die as possible, SRAM circuitry requires minimal cell and read/write circuit architectures. To support minimal architectures, a memory cell is accessed by enabling a row wordline wire and enabling a selected column-gating transistor to read the value from the memory cell.

The use of memory circuits in battery-operated and other low-voltage devices make it desirable to operate the memory circuits at lowest voltage possible. Typically, when read or write operations are done in memory arrays, the wordline is set high with the power applied while the information stored in the memory cells is read by being transferred onto bitlines or information on the bitlines is written by being stored in the memory cells. For read operations, bitlines are then read by a sense-amplifier, or sense-amp. Sense-amps are common to all memories whether the memories are dynamic, static, Flash, or other types of memories. For write operations, information on the bitlines change the held charge in the memory cell. While the wordline is kept on, power is being consumed. The wordline remains on during and after the desired operation, whether it is a read or a write, to ensure the operation is complete; i.e., power is consumed even when no longer required.

Reading reliable results from memory circuits operating at a low-power supply voltage is complicated by the large capacitance of the wordlines and the threshold drop produced by the gating transistor. Low-power supply voltages reduce memory speed, and at very low voltages, the reliability of the information drops.

To address the reliability problem, memory circuits, which have a bootstrapped boost voltage applied to the wordlines, have been developed. The row wordline is charged to a voltage that is higher than the power supply line. In addition, the row wordline is charged prior to accessing the memory location by switching on the column-gating transistor. Boost circuits provide reliable memory operation at low voltages.

One of the problems with boost circuits is that at high voltages, the access circuitry is over-stressed. This limits the upper end of the power supply operating range of a memory device.

Another problem is that boosting increases the power consumption of a memory circuit. At high supply voltages, the power dissipation can exceed tolerable levels and the memory circuitry is subject to failures due to overheating.

Power saving has been a persistent need. Because low-power consumption is becoming even more important, it is desirable to provide a method and apparatus for operating a memory device in a manner that saves power. Furthermore, it is desirable to achieve reliable read and write operations at low voltages.

With the urgency of increasing speed and saving power, solutions to these problems have been long sought but have long eluded those skilled in the art.

DISCLOSURE OF THE INVENTION

The present invention provides a memory system, and method of operation therefor, having memory cells for containing data, bitlines for writing data in and reading data from the memory cells, and wordlines connected to the memory cells for causing the bitlines to write data in the memory cells in response to wordline signals. A decoder is connected to the wordlines for receiving and decoding address information in response to a clock signal and an address signal to select a wordline for a write to a memory cell. Latch circuitry is connected to the decoder and the wordlines. The latch circuitry is responsive to the clock signal for providing the wordline signal to the selected wordline for the write to the memory cell and for removing the wordline signal from the selected wordline when the write to the memory cell is complete. The memory system conserves power while permitting reliable read and write operations at low voltages.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
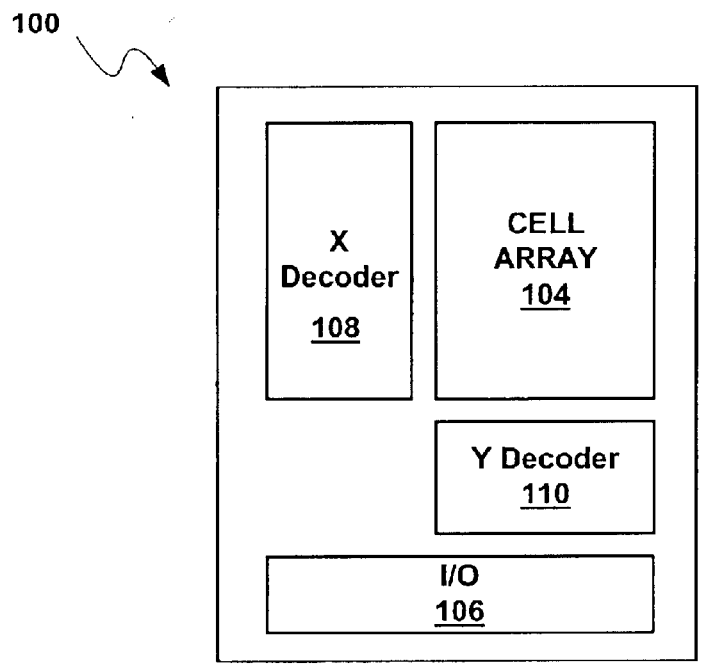
FIG. 1 is a block diagram of an SRAM in accordance with the present invention.

Referring now to FIG. 1, therein is shown a block diagram of an SRAM 100, with core regions typically including one or more M×N arrays 104 of individually addressable, substantially identical memory cells. Peripheral portions typically include input/output (I/O) circuitry and programming circuitry for selectively addressing the individual memory cells in accordance with the present invention. The cell access circuitry is represented in part by and includes one or more x-decoders 108 and y-decoders 110, cooperating with I/O circuitry 106 for connecting the source, gate, and drain of selected addressed memory cells to predetermined voltages or impedances to effect designated operations on the memory cell, e.g., programming, writing, reading, erasing, and deriving necessary voltages to effect such operations.

Figure 2:
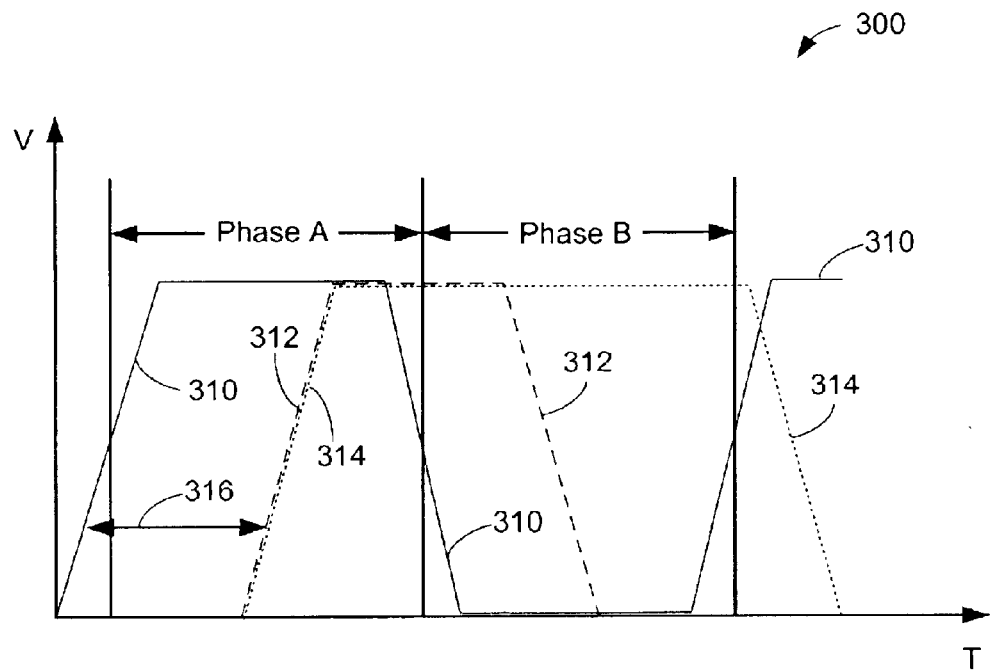
FIG. 2 is a timing diagram showing operative signals in accordance with the present invention.

Referring now to FIG. 2, therein is shown is a timing diagram 300 having a vertical voltage axis and a horizontal time axis. A clock signal 310 and two wordline signals 312 and 314 are shown in accordance with the present invention. The clock signal 310 is cyclic and a full cycle and part of a subsequent cycle are shown. The clock signal 310 also has two phases: Phase A and Phase B measured from about the middle of the rise and fall times such that the clock signal 310 is going high to a digital one in the beginning of Phase A, low to a digital zero in the beginning of Phase B, and high to a digital one in the beginning of the next subsequent phase. The wordline signal 312 shows the duration during which a wordline signal remains at a high voltage, or high, on a wordline for a read-only operation. The wordline signal 314 shows the duration during which a wordline signal remains latched high on a wordline for a read-write operation to respectively read data in and write data to a memory cell.

A time delay 316 is shown because the wordline signals 312 and 314 are triggered by the beginning of the clock signal 310 but are delayed in reaching the wordlines because of decoding and other processes required before the wordline signals 312 and 314 can be imposed on the wordlines. The various signals overlap at various times and voltages but are shown offset in FIG. 2 in the interests of clarity. This is true for all the timing diagrams herein.

The present invention can be applied to read-modify write schemes where write operations are performed after read operations. In certain embodiments of the present invention, read and write operations can occur in a single clock cycle. Accordingly, read operations from the M×N cell array 104 of FIG. 1 occur during both read-only operations and write operations.

For a read-only operation, the wordline signal goes high ideally at the start of Phase A as shown by the wordline signal 312. The read operation is triggered by a falling clock edge of the clock signal 310. According to the present invention, the wordline signal 312 is shut down as soon as possible after the read operation to conserve power since power is being consumed whenever the wordline signal is being provided If a write operation is desired, the wordline signal goes high ideally at the start of Phase A as shown by the wordline signal 314 and is extended throughout Phase B so that the write operation can occur within Phase B. However, the wordline signal 314 is unlatched and shut down as soon as possible after Phase B to conserve power.

Figure 3:
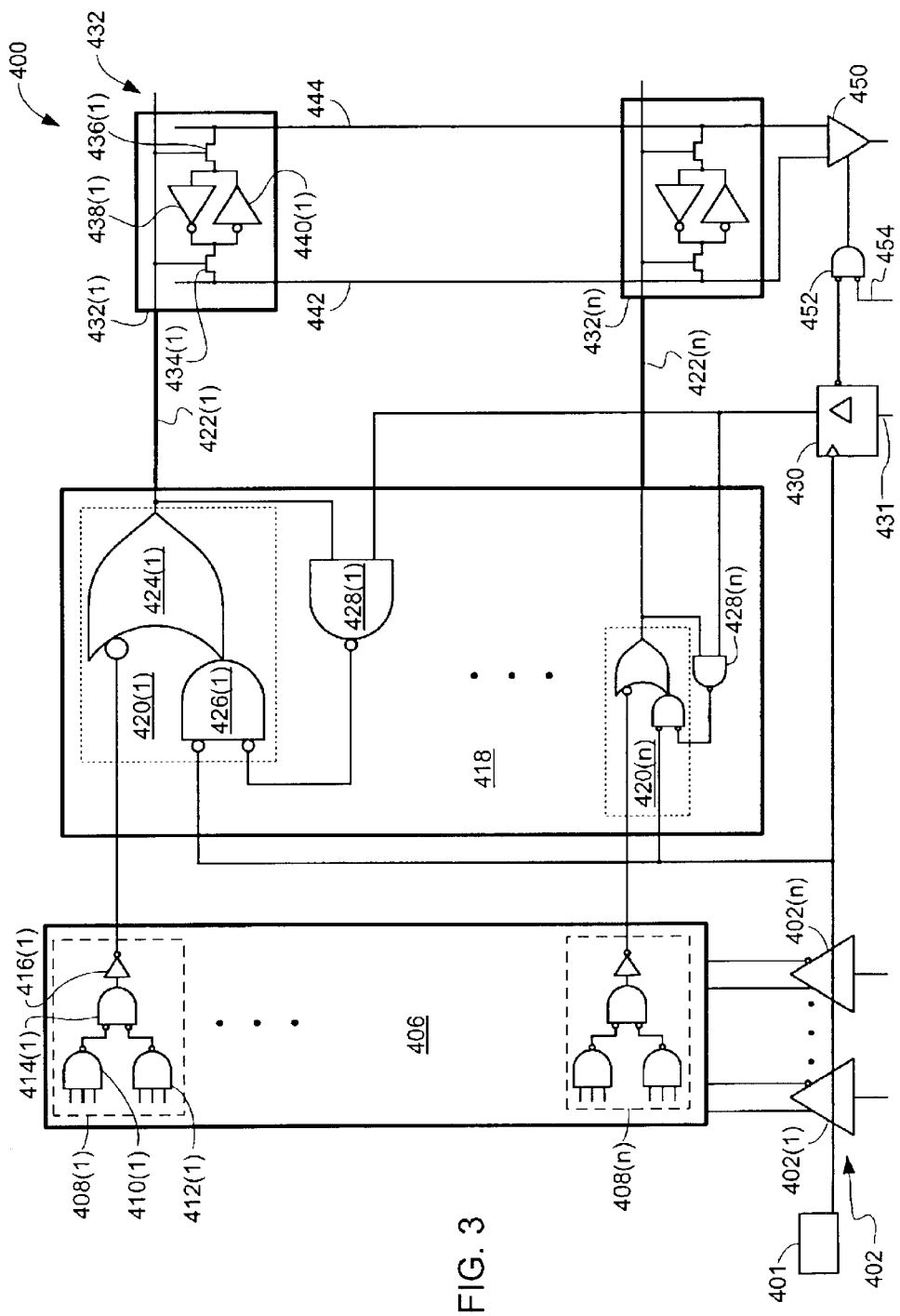
FIG. 3 is a schematic diagram of a memory circuit in accordance with the present invention.

Referring now to FIG. 3, therein is shown a schematic diagram of a wordline latching memory circuit 400 in accordance with the present invention. A clock 401 is connected to clock inputs of a set of address flip-flops 402. The set of address flip-flops 402 include one or more address flip-flops 402(1 . . . n) for 1 . . . n wordlines. In one embodiment, the address flip-flops 402(1 . . . n) are monotonic, or in continuous sequence, and each provide true and complementary outputs.

The set of address flip-flops 402 is connected to a decoder 406, which causes the time delay 316 of FIG. 2. The decoder 406 includes decoding circuits 408(1 . . . n) for decoding address information. Each of the decoding circuits 408(1 . . . n) includes a pair of NAND gates 410(1 . . . n) and 412(1 . . . n), which have outputs respectively coupled to an input of AND gates 414(1 . . . n), which have respective outputs connected to an input of inverters 416(1 . . . n). The outputs of the inverters 416(1 . . . n) are the outputs of the decoder 406.

The decoder 406 can be of several types such as static decoders (shown on FIG. 3), dynamic decoders, or two-bit pre-decoders.

The decoder 406 connects to latch circuitry 418. The latch circuitry 418 includes a set of OAI gates 420(1 . . . n), which are respectively connected to the inverters 416(1 . . . n) of the decoder 406. The number of OAI gates 420 can vary depending on the specific application, but generally it is equal to the number of wordlines. For example, the OAI gates 420(1 . . . n) are respectively connected to wordlines 422(1 . . . n). The decoder 406 decodes the address information to select the wordlines 422(1 . . . n), which will be activated when they have been selected.

Each of the OAI gates 420(1 . . . n) includes an OR gate 424(1 . . . n) and an AND gate 426(1 . . . n). Each of the outputs from the inverters 416(1 . . . n) respectively connects to first inverting inputs of the OR gate 424(1 . . . n), and each of the outputs of the AND gate 426(1 . . . n) respectively connects to second inverting inputs of the OR gates 424(1 . . . n). The outputs of the OR gates 424(1 . . . n) are the respective output of the OAI gates 420(1 . . . n) to the wordlines 422(1 . . . n). The outputs of the OR gate 424(1 . . . n) also respectively connect to first inputs of NAND gates 428(1 . . . n). The NAND gates 428(1 . . . n) have respective outputs connected to first inverting inputs of the AND gate 426(1 . . . n). Second inverting inputs of the AND gate 426(1 . . . n) are connected to the clock 401.

The clock 401 also connects to a write-enable flip-flop 430, which responds to a write-enable signal 531 and has an output that connects to second inputs of the NAND gates 428(1 . . . n).

The wordlines 422(1 . . . n) are respectively connected to a set of memory cells 432 having memory cells 432(1 . . . n). The memory cells 432(1 . . . n) respectively include two pass transistors 434(1 . . . n) and 436(1 . . . n) having gates to which the wordlines 422(1 . . . n) are respectively connected. The two pass transistors 434(1 . . . n) and 436(1 . . . n) are respectively coupled to two inverters 438(1 . . . n) and 440(1 . . . n) and to two bitlines 442 and 444. It will be understood that there will be a plurality of bitlines in the cell array 104, but only two are shown.

The two bitlines 442 and 444 are connected to sensing circuitry such as a sense-amp 450. The sense-amp 450 is one of a plurality of sense-amps connected across the respective plurality of bitlines. The write-enable flip-flop 430 connects to a first inverting input of a read-enable AND gate 452 and the output of the read-enable AND gate 452 connects to the sense-amp 450 (and to other sense-amps for the other bitlines). A second inverting input of the read-enable AND gate 452 is connectable receive to an enable signal 454.

Figure 4:
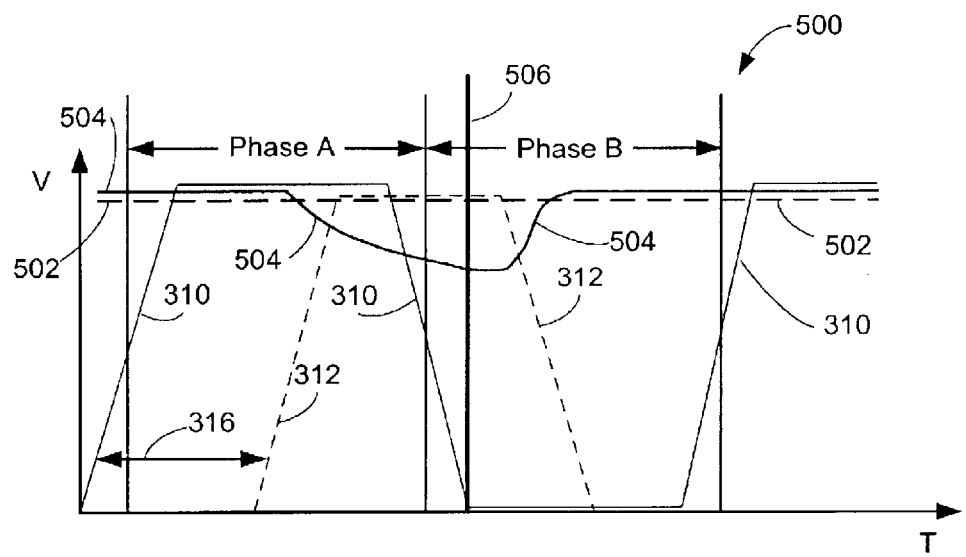
FIG. 4 is a timing diagram of a read-only operation in accordance with the present invention.

Referring now to FIG. 4, therein is shown a timing diagram 500 having a vertical voltage axis and a horizontal time axis. The timing diagram 500 is for a read-only operation. The clock signal 310 is shown with the wordline signal 312, which represents the duration in which a wordline signal remains high for the read-only operations. In accordance with the present invention, two bitline signals 502 and 504 are shown. The bitline signals 502 and 504 represent signals on the bitlines such as the bitlines 442 and 444 of FIG. 3, respectively. A vertical line 506 represents the approximate trigger point of the sense-amp 450.

The wordline signal 312 rises shortly after the clock signal 310 rises, due to the time delay 316. When the wordline signal 312 goes high, a differential builds. The bitline signal 502 stays high all the time because it is connected to a high voltage side of the memory cell 432(1) of FIG. 3. The bitline signal 504 slowly drops and is connected to the low voltage side of the memory cell 432; there is typically a 0 voltage at that point. Accordingly, there is a small voltage differential between the bitline signals 502 and 504 indicative of a logical state of the memory cell 432(1). In order for the overall circuit to operate properly the differential must be amplified so that the signal goes from zero to high. The sense-amp 450 amplifies the differential to provide a so-called full-swing voltage. The bitline signal 504 lowers in voltage due to a capacitance on the transistor 436(1) of FIG. 3. The transistor 436(1) of FIG. 3 has capacitance switch discharges causing the bitline signal 504 to lower in voltage.

The bitline signal 504 begins to rise again after the wordline signal 312 goes low. As the wordline signal 312 goes low, the bitline signal 504 is not being pulled down. So the bitline signal 504 gets charged back up. The bitline signal 504 is charged back up because the bitline signal 504 is always connected to a Vdd voltage source (not shown). A vertical line represents an approximate sense-amp trigger point 506 of the sense-amp 450. This trigger point is important where the wordline latch circuit is a synchronous design, as it is in this specific embodiment. Because it is synchronous, events occur on the falling or rising edge of the clock cycle, subject to some delays; e.g., by the decoder delay.

During a write operation, the wordline 422(1) goes low immediately after the write operation completes by using the falling edge of the clock signal 310 to release the latch of the wordline signal 314. If the wordline 422(1) goes low too soon, a write signal 603 to the bitlines 442 and 444 will not be able to write to the memory cell 432(1) because it will be shut off.

Figure 5:
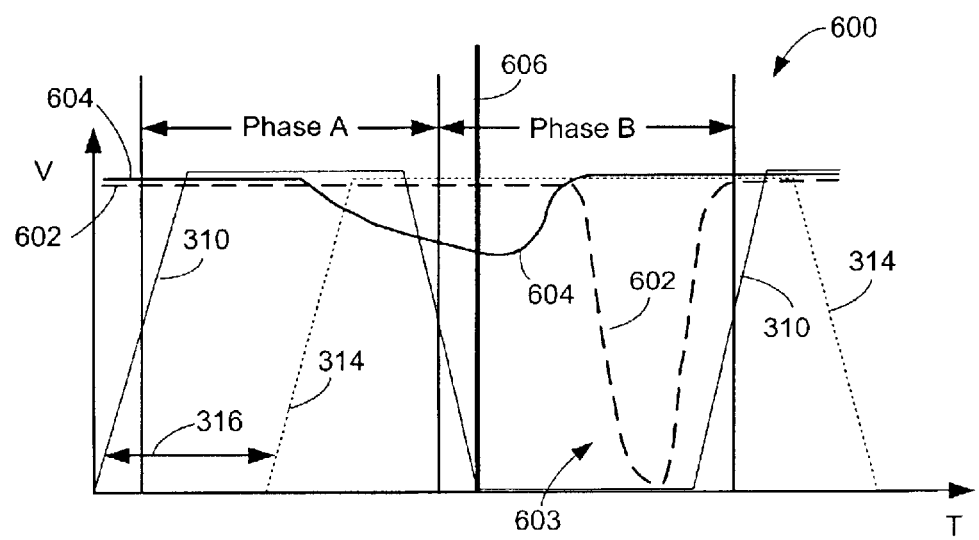
FIG. 5 is a timing diagram of the read-write operation in accordance with the present invention.

Referring now to FIG. 5, therein is shown a timing diagram 600 having a vertical voltage axis and a horizontal time axis. The timing diagram 600 is for a write operation. The clock signal 310 and bitline signals 602 and 604 are shown in accordance with the present invention. During the write operation in the Phase B, the memory cell 432(1) is turned on; i.e., the pass transistors are turned on, connecting memory cell to the bitlines. The wordline signal 314 shows the duration in which the wordline signal 314 remains high for write operations.

The operation of wordline latching memory circuit 400 is hereinafter described with reference FIGS. 3–5.

The address signals enter the address flip-flops 402(1 . . . n) timed by the clock signals 310 from the clock 401. When the clock 401 is asserted high, the set of address flip-flops 402 is triggered creating a set of true and complimentary signals that are fed to the decoder 406. The address flip-flops 402(1 . . . n) selectively enable or disable the wordlines 422(1 . . . n) by providing selected signals to the groups of six inputs of the decoding circuits 408(1 . . . n) in the decoder 406.

The following is an example of the operation of the wordline latching memory circuit 400 for a single wordline.

For a read-only operation, when the decoder 406 determines the wordline 422(1) has been selected, the NAND circuit 408(1) outputs a low to the OAI gate 420(1). In the OAI gate 420(1), the inverting input of OR gate 424(1) is pulled low causing the output of OAI gate 420(1) to rise as shown by the wordline signal 312.

The write-enable signal 431 is held low so the output of the write-enable flip-flop 430 is also forced low upon being triggered by the clock signal 310 from the clock 401. This forces the output of NAND gate 428(1) to be high, effectively disabling the AND gate 426(1) and causing the OAI gate 420(1) to provide a high on to the wordline 422(1). The high on the wordline 422(1) activates the memory cell 432(1) to place bitline signals 502 and 504, representative of previously stored high or lows signals, to be transferred onto the bitlines 442 and 444.

When the clock signal 310 falls, the outputs of the address flip-flops 402(1 . . . n) are forced low to conserve power but the wordline signal 312 remains high because of the time delay 316.

The read operation is performed while the wordline signal 312 is high and after the clock signal 310 reaches its low at the approximate sense-amp trigger point 506. The sense-amp 450 is triggered by the clock signal 310 and the enable signal 454 via the read-enable AND gate 452 to read the bitlines 442 and 444 for the bitline signals 502 and 504. The sense-amp 450 latches the data from the bitline signal 504 from the bitline 444.

Shortly after the triggering of the sense-amp 450, the wordline signal 312 falls to its low.

For a read, the effective power cut-off to all the wordlines around the beginning of the falling edge of the clock signal 310 conserves power and the read at around the end of the falling edge of the clock signal 310 assures the security of the read operation.

The operation of the wordline latching memory circuit 400 for the write operation is similar to that of the read operation. The main difference is that the wordline is being held high longer, but not so long that it interferes with the next clock cycle.

For a write operation, when the decoder 406 determines the wordline 422(1) has been selected, the NAND circuit 408(1) outputs a low to the OAI gate 420(1). In the OAI gate 420(1), the inverting input of OR gate 424(1) is pulled low causing the output of OAI gate 420(1) to rise as shown by the wordline signal 314.

The write-enable signal 431 is held high so the output of the write-enable flip-flop 430 is also forced high upon being triggered by the clock signal 310 from the clock 401. This forces the output of NAND gate 428(1) to be low, enabling the AND gate 426(1) and causing the OAI gate 420(1) to provide a high on to the wordline 422(1). The high on the wordline 422(1) activates the memory cell 432(1) to place the bitline signals 502 and 504, representative of previously stored high or lows signals, onto the bitlines 442 and 444.

When the clock signal 310 falls, the outputs of the address flip-flops 402(1 . . . n) are forced but the wordline signal 314 remains high even when the decoder 406 provides a low to the OAI gate 420(1). With the write-enable flip-flop 430 providing a high and the OAI gate 420(1) providing a high, the NAND GATE 428(1) provides a low to the first inverting input of the AND gate 426(1) while the clock 401 provides a second low to the second inverting input. As a result, the AND gate 426(1) provides a high to the OR gate 424(1) to latch the wordline 422(1) in high.

The read operation can optionally be performed during Phase A.

The write operation is performed while the wordline signal 314 is still high in Phase B as indicated by the write pulse placed on the bitline 442 by the bitline signal 602 from the I/O circuitry 106 of FIG. 1.

The combination of the NAND gate 428(1) and the OAI gate 420(1) forms a latch which holds the wordline 422(1) high until the clock signal 310 starts rising again causing AND gate 426(1) to unlatch the output of the OAI gate 420(1) and de-assert the wordline 422(1).

For a write, the effective power cut-off to all the wordlines around the beginning of the rising edge of the clock signal 310 assures the safety of the successful read operation in the next cycle.

Embodiments of the present invention can have several applications. In some applications the wordline latch circuit can be used in cache memory. Typically, cache memories are built of one or more smaller memory blocks called banks. The wordline latch circuit can be used inside the banks of cache memory. Other embodiments can be used outside of cache memory as well.

When used in a microprocessor for example, the microprocessor generates the memory addresses where the data resides. The microprocessor can have several layers of memory. There is a so-called Level 1 (L1) memory and a Level 2 (L2) memory, sometimes a Level 3 (L3) memory. There is also a main memory. The main memory is also called external memory because it is typically external to the microprocessor. L1 memory is the easiest and fastest memory to access. When the microprocessor looks for data it will typically start with L1 memory, then will go to L2 memory, then L3 memory, and finally to the main memory.

If the microprocessor fetches data from the main memory it could take about 100–150 clock cycles to fetch. This is slow compared to 1 to 2 clock cycles that would be required to fetch data from the cache memory. Thus there are compelling reasons to have data stored on the chip itself.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters hither-to-fore set forth herein or shown in the accompanying drawings are to be interpreted in an illustrative and non-limiting sense.

The invention claimed is:

1. A memory system comprising:

memory cells for containing data;

bitlines to write data in and read data out from the memory cells;

wordlines connected to the memory cells for causing the bitlines to write data in the memory cells in response to wordline signals;

a decoder connected to the wordlines to receive and decode address information in response to a clock signal and an address signal to select a wordline for a write to a memory cell;

latch circuitry connected to the decoder and the wordline and having a first gate to provide a wordline signal in response to the clock signal, the latch circuitry having a second gate connected to the first gate and the wordline, the second gate responsive to a write-enable signal and the wordline signal to provide a signal to the first gate.

2. The memory system as claimed in claim 1 wherein:

the first gate is a OR-AND-Invert gate; and the second gate is a NAND gate.

3. The memory system as claimed in claim 1 including:

write-enable circuitry connected to receive the clock signal and an initiate write signal to provide the write-enable signal in response to the clock signal.

4. The memory system as claimed in claim 1 including:

sensor circuitry connected to the bitlines to read data from the memory cells in response to a read-enable signal; and read-enable circuitry connected to the sensor circuitry to receive the clock signal and responsive an initiate read signal and the clock signal to provide the read-enable signal.

5. The memory system as claimed in claim 1 including:

a clock providing the clock signal, the clock signal is a cyclic signal having rising and falling edges in each cycle.

6. A memory system comprising:

memory cells for containing data;

bitlines for writing data in and reading data from the memory cells;

wordlines for causing the bitlines to write data in the memory cells in response to wordline signals;

a decoder to receive decode address information in response to a clock signal and an address signal to select a wordline for a write to a memory cell, the decoder is responsive to the clock signal having rising and falling edges, the decoder responsive to the rising edge to start the decode and the falling edge to stop the decode; and latch circuitry responsive to the clock signal to provide the wordline signal to the selected wordline for the write to the memory cell and to remove the wordline signal from the selected wordline when the write to the memory cell is complete, the latch circuitry is responsive to the falling edge and a write-enable signal to latch the wordline signal on the selected wordline for the write to the memory cell, the latch circuitry responsive to the second rising edge to unlatch the wordline signal from the selected wordline.

7. A memory system comprising:

memory cells for containing data;

bitlines for writing data in and reading data from the memory cells;

wordlines for causing the bitlines to write data in the memory cells in response to wordline signals;

a decoder to receive and decode address information in response to a clock signal and an address signal to select a wordline for a write to a memory cell, the decoder is responsive to the clock signal having rising and falling edges, the decoder responsive to the raising edge to start the decode and the falling edge to stop the decode;

latch circuitry responsive to the clock signal to provide the wordline signal to the selected wordline for the write to the memory cell and to remove the wordline signal from the selected wordline when the write to the memory cell is complete; and sensor circuitry connected to the bitlines and responsive to the falling edge and a read-enable signal to read data from the memory cells.

8. A memory system comprising:

memory cells for containing data;

bitlines for writing data in and reading data from the memory cells;

wordlines for causing the bitlines to write data in the memory cells in response to wordline signals;

a decoder to receive and decode address information in response to a clock signal and an address signal to select a wordline for a write to a memory cell;

latch circuitry responsive to the clock signal to provide the wordline signal to the selected wordline for the write to the memory cell and to remove the wordline signal from the selected wordline when the write to the memory cell is complete; and a clock providing the clock signal, the clock signal having rising and falling edges wherein:

the decoder is responsive to the onset of the raising edge to start the decode and the onset of the falling edge to stop the decode; and the latch circuitry is responsive to the middle of the falling edge and a write-enable signal to latch the wordline signal on the selected wordline for the write to the memory cell, the latch circuitry responsive to the middle of the second rising edge to unlatch the wordline signal from the selected wordline.

9. The memory system as claimed in claim 6 wherein:

the latch circuitry includes circuitry to provide the wordline signal to the selected wordline for a read of the memory cell and to remove the wordline signal from the selected wordline when the read of the memory cell is complete.

10. The memory system as claimed in claim 7 wherein:

the latch circuitry includes circuitry to provide the wordline signal to the selected wordline for a read of the memory cell and to remove the wordline signal from the selected wordline when the read of the memory cell is complete.

11. The memory system as claimed in claim 8 wherein:

the latch circuitry includes circuitry to provide the wordline signal to the selected wordline for a read of the memory cell and to remove the wordline signal from the selected wordline when the read of the memory cell is complete.

12. A method for memory system operation comprising:

providing memory cells for containing data;

writing data in and reading data from the memory cells on bitlines;

responding to wordline signals on wordlines by causing the bitlines to write data in the memory cells;

selecting a wordline for a write to a memory cell using a decoder for receiving and decoding address information in response to a clock signal and an address signal;

responding to the clock signal and selecting a wordline for providing a wordline signal using a first gate; and responding to a write-enable signal and the wordline signal to provide a latch signal to the first gate using a second gate.

13. The method for memory system operation as claimed in claim 12 wherein:

responding to the clock signal and selecting a wordline uses the first gate having a OR-AND-Invert gate; and responding to a write-enable signal and the wordline signal uses the second gate having a NAND gate.

14. The method for memory system operation as claimed in claim 12 wherein:

responding to the write-enable signal uses a write-enable circuitry for receiving the clock signal and an initiate write signal for providing the write-enable signal.

15. The method for memory system operation as claimed in claim 12 including:

reading data from the memory cells in response to a read-enable signal using sensor circuitry connected to the bitlines; and receiving the clock signal and an initiate read signal to provide the read-enable signal using read-enable circuitry connected to the sensor circuitry.

16. The method for memory system operation as claimed in claim 12 including:

providing the clock signal provides a cyclic signal having rising and falling edges in each cycle.

17. A method for memory system operation comprising:

providing memory cells for containing data;

writing data in and reading data from the memory cells on bitlines;

responding to wordline signals on wordlines by causing the bitlines to write data in the memory cells;

selecting a wordline for a write to a memory cell using a decoder for receiving and decoding address information in response to a clock signal and an address signal, selecting the wordline includes responding to rising edge of the clock signal by the decoder to start decoding and a falling edge of the clock signal to stop decoding; and latching a wordline signal in response to the clock signal by providing the wordline signal to the selected wordline for the write to the memory cell and for unlatching the wordline signal from the selected wordline when the write to the memory cell is complete, latching the wordline signal includes:

responding to the falling edge and a write-enable signal by latching the wordline signal on the selected wordline for writing to the memory cell; and responding to the second rising edge by unlatching the wordline signal from the selected wordline.

18. A method for memory system operation comprising:

providing memory cells for containing data;

writing data in and reading data from the memory cells on bitlines;

responding to wordline signals on wordlines by causing the bitlines to write data in the memory cells;

selecting a wordline for a write to a memory cell using a decoder for receiving and decoding address information in response to a clock signal and an address signal selecting the wordline includes responding to the clock signal having a rising and falling edges to start decoding on the raising edge and to stop decoding on the falling edge;

latching a wordline signal in response to the clock signal by providing the wordline signal to the selected wordline for the write to the memory cell and for unlatching the wordline signal from the selected wordline when the write to the memory cell is complete; and responding to the falling edge and a read-enable signal for reading data from the memory cells by sensor circuitry.

19. A method for memory system operation comprising:

providing memory cells for containing data;

writing data in and reading data from the memory cells on bitlines;

responding to wordline signals on wordlines by causing the bitlines to write data in the memory cells;

selecting a wordline for a write to a memory cell using a decoder for receiving and decoding address information in response to a clock signal and an address signal;

latching a wordline signal in response to the clock signal by providing the wordline signal to the selected wordline for the write to the memory cell and for unlatching the wordline signal from the selected wordline when the write to the memory cell is complete; and providing the clock signal having rising and falling edges including:
responding to the middle of the raising edge to start decoding and the middle of the falling edge to stop decoding by the decoder; and
responding to the middle of the falling edge and a write-enable signal for latching the wordline signal on the selected wordline for the writing to the memory cell and responding to the middle of the second rising edge for unlatching the wordline signal from the selected wordline.

20. The method for memory system operation as claimed in claim 17 including:

providing the wordline signal to the selected wordline for reading of the memory cell and removing the wordline signal from the selected wordline when the reading of the memory cell is complete.

21. The method for memory system operation as claimed in claim 18 including:

providing the wordline signal to the selected wordline for reading of the memory cell and removing the wordline signal from the selected wordline when the reading of the memory cell is complete.

22. The method for memory system operation as claimed in claim 19 including:

providing the wordline signal to the selected wordline for reading of the memory cell and removing the wordline signal from the selected wordline when the reading of the memory cell is complete.

* * * * *